United States Patent
Itoh

(10) Patent No.: US 6,317,865 B1
(45) Date of Patent: Nov. 13, 2001

(54) WIRING-CAPACITANCE IMPROVEMENT AID DEVICE AIDING IN IMPROVEMENT OF POINTS HAVING WIRING-CAPACITANCE ATTRIBUTABLE ERROR ONLY WITH LAYOUT MODIFICATION, METHOD THEREOF, AND MEDIUM HAVING A PROGRAM THEREFOR RECORDED THEREIN

(75) Inventor: Niichi Itoh, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/275,083

(22) Filed: Mar. 24, 1999

(30) Foreign Application Priority Data

Oct. 23, 1998 (JP) .................................. 10-302744

(51) Int. Cl.[7] .................................. G06F 15/60
(52) U.S. Cl. .................................. 716/11; 716/2
(58) Field of Search .................................. 716/11, 18, 2; 395/183.04

(56) References Cited

U.S. PATENT DOCUMENTS

| | | | |
|---|---|---|---|
| 5,675,728 | * 10/1997 | Kunda et al. | 395/183.04 |
| 6,145,117 | * 11/2000 | Eng | 716/18 |
| 6,173,435 | * 1/2001 | Dupenloup | 716/18 |

FOREIGN PATENT DOCUMENTS

| | | |
|---|---|---|
| 7-14927 | 1/1995 | (JP) . |
| 7-221187 | 8/1995 | (JP) . |
| 10-207937 | 8/1998 | (JP) . |

* cited by examiner

Primary Examiner—David Nelms
Assistant Examiner—Thong Le
(74) Attorney, Agent, or Firm—McDermott, Will & Emery

(57) ABSTRACT

A wiring-capacitance improvement aid device aiding in eliminating a capacitance-attributable error of layout data generated by an automatic arrangement and routing tool includes a subject-net extraction portion extracting a subject net with a capacitance-attributable error, a network rip-up portion ripping up a cell netted within a predetermined range with respect to a subject net extracted by the subject-net extraction portion, and a constraint imposition portion imposing a wiring-capacitance constraint on a net connected to a cell ripped up by the network rip-up portion.

15 Claims, 17 Drawing Sheets

*FIG.19* backword trace ######

① ## <inst> I1 (FD1W)
②    D <net> I2.Y {Cx=4.791 Cn=0.39536 Cw=0.25936 Cp=0.136 F=40}
③      Y <inst> I2 (R02S)
④        A <net> I4.Q {Cx=4.025 Cn=1.45771 Cw=1.33771 Cp=0.12 F=20}
⑤        B <net> I5.Y {Cx=8 Cn=0.24526 Cw=0.16526 Cp=0.08 F=40}

⑥ ## <inst> I1 (FD1W)
⑦    C <net> I3.Y {Cx=4.025 Cn=0.50906 Cw=0.37306 Cp=0.136 F=20}
⑧      Y <inst> I3 (V01S)
⑨        A <net> I6.Y {Cx=9.26 Cn=2.51486 Cw=2.35486 Cp=0.16 F=20}

WIRING-CAPACITANCE IMPROVEMENT AID DEVICE AIDING IN IMPROVEMENT OF POINTS HAVING WIRING-CAPACITANCE ATTRIBUTABLE ERROR ONLY WITH LAYOUT MODIFICATION, METHOD THEREOF, AND MEDIUM HAVING A PROGRAM THEREFOR RECORDED THEREIN

BACKGROUND OF THE INVENTION

1. Field of the Invention

The present invention relates to automatic arrangement and routing technology for semiconductor integrated circuits and in particular to wiring-capacitance improvement aid devices capable of aiding in improving a point having an error attributable to wiring capacitance only through layout modification, methods of aiding in improvement of wiring capacitance, and media having recorded therein a program aiding in improvement of wiring capacitance.

2. Description of the Background Art

In recent years, there is an increasing demand for more efficient, automatic arrangement and routing tools as semiconductor integrated circuits are increasingly of multi-function, high integration and larger in their operating frequencies.

FIG. 1 is a block diagram for illustrating various files used by a conventional, automatic arrangement and routing tool. Files used by automatic arrangement and routing tool 107 include a net list information file 101 storing net list information produced from a logic circuit designed by a user, a macro cell library 102 used in converting a macro cell (referred to as a "cell" hereinafter) in transistor level, a command file 103 storing a command executed by the automatic arrangement and routing tool, a P&R (automatic arrangement and routing) control file 104 for storing a description, such as a wiring-capacitance constraint on a net and a cell-arrangement constraint, a user definition file 105 for storing e.g. a constraint value of a net on which a wiring-capacitance constraint is imposed, and a layout data file 106 for storing layout data after the automatic arrangement and routing tool performs arrangement and routing.

The net list information produced from the logic circuit designed by the user and is stored previously in net list information file 101 prior to automatic arrangement and routing. Macro cell library 102 stores transistor-level information converted from a cell in arranging and routing the cell. Command file 103 stores in batch-file form a command to be executed when automatic arrangement and routing tool 107 performs arrangement and routing.

In arrangement and routing, the user can constrain the wiring capacitance of a net and cell arrangement and store a description of a wiring-capacitance constraint imposed on the net and a cell-arrangement constraint in P&R control file 104. The user can also store in user definition file 105 such information as a constraint value of a net on which a wiring-capacitance constraint is imposed, a location at which a cell with an arrangement constraint is arranged, and the like.

Automatic arrangement and routing tool 107 successively reads and executes commands in command file 103 to perform arrangement and routing. If any wiring-capacitance constraint on a net and any cell-arrangement constraint are described in P&R control file 104, automatic arrangement and routing tool 107 refers to user definition file 105 and thus performs arrangement and routing to satisfy the constraints. Automatic arrangement and routing tool 107 then stores in layout data file 106 the layout data obtained after the arrangement and routing.

While arrangement and routing is performed in accordance with the procedure described above, the resultant layout data can include inconveniences such as errors attributable to capacitance that are associated with generation an error attributable to connectable, maximum capacitance (referred to as a "Comax error" hereinafter), i.e. a sum of the actual capacitance values of driven cells that exceeds a connectable, maximum capacitance value of a driving cell (referred to as a "Comax value" hereinafter), generation of a timing error when layout data is used to perform timing simulation, and the like.

A procedure of detecting the Comax error is as follows: initially, a tool other than automatic arrangement and routing tool 107 extracts a wiring capacitance, a wiring resistance and the like from the layout data stored in layout data file 106 and stores them in a capacitance and resistance extraction file. Furthermore, still another tool calculates a capacitance value of each cell from the wiring capacitance and the like stored in the capacitance and resistance extraction file for comparison to a Comax value previously stored in a delay library to detect a Comax error.

Conventionally, when an error attributable to capacitance as described above is caused the error is eliminated mainly by enhancing the driving capability of a cell and the arrangement of the cell is hardly modified to eliminate the error. If the arrangement of the cell is modified to eliminate the error, the following operation is required. Elimination of a Comax error, which can be performed relatively readily, will now be described with reference to the layout data shown in FIG. 2.

Initially, the user examines cells connected to a net N1 with a Comax error caused while referring to a net list. As a result, cells C1.1 to C1.4 are extracted. The user also examines any nets connected to cells C1.1 to C1.4 and any cells connected to the nets to extract nets N2.1 to N2.6 and cells C2.1 to C2.5. The user refers to the capacitance and resistance extraction file to obtain the respective current capacitance values of nets N2.1 to N2.6. The user then refers to the delay library to obtain the respective Comax values of cells C1.1 to C1.4 and C2.1 to C2.5 to obtain the respective margins of the capacitance values with respect to the Comax values. Then any cells of the extracted cells that have margin in capacitance are extracted and determined as the cells which can be modified in arrangement.

The user then manually modifies in arrangement the cells which can be modified in arrangement or imposes a capacitance constraint or the like on the cells to perform an engineering change order (ECO) to again perform automatic arrangement and routing.

The method of eliminating errors through modification of cell arrangement described above, however, disadvantageously requires great effort of the layout designer when he or she determines a cell which can be modified in arrangement, since the layout designer normally does not have the drawing of the logic circuit of interest and are accordingly forced to use a net list and layout data after arrangement and routing to determine a cell which can be modified in arrangement. In particular, a net with large fan-out has a large number of cells connected thereto and the net itself is so complex that the layout designer is forced to perform extremely cumbersome operation. In eliminating a timing error, the cause of the timing error must be determined before cell arrangement is modified. This renders the operation further cumbersome.

Moreover, with semiconductor integrated circuits having larger operating frequencies in recent years, an operating margin for delay of each logic circuit can hardly be ensured so that operation can often be ensured only in circuit configuration constructed according to virtual design. This is because when a cell with a capacitance-attributable error is changed in circuit to a cell with a higher driving capacity to eliminate the error, the fixed delay value of the cell itself is increased and an additional, timing error is disadvantageously caused. While there is an increasing need for eliminating errors through modification in cell arrangement, the method described above is not effective as long as the above disadvantageous are not solved.

SUMMARY OF THE INVENTION

One object of the present invention is to provide a wiring-capacitance improvement aid device which does not require the user to perform any cumbersome operations and so aids that a capacitance-attributable error caused after arrangement and routing can be eliminated only through modification in cell arrangement.

Another object of the present invention is to provide a wiring-capacitance improvement aid device capable of outputting information required when the user manually modifies the arrangement of a cell.

Still another object of the present invention is to provide a wiring-capacitance improvement aid method which does not require the user to perform any cumbersome operations and so aids that a capacitance-attributable error caused after arrangement and routing can be eliminated only through modification in cell arrangement.

Still another object of the present invention is to provided a wiring-capacitance improvement aid method capable of outputting information required when the user manually modifies the arrangement of a cell.

Still another object of the present invention is to provide a medium having recorded therein a wiring-capacitance improvement aid program so aiding that a capacitance-attributable error caused after arrangement and routing can be eliminated only through modification in cell arrangement.

Still another object of the present invention is to provide a medium having recorded therein a wiring-capacitance improvement aid program capable of outputting information required when the user manually modifies the arrangement of a cell.

In one aspect of the present invention, the wiring-capacitance improvement aid device is that which aids in eliminating a capacitance-attributable error of layout data generated by an automatic arrangement and routing tool performing arrangement and routing while referring to a wiring-capacitance constraint, including a subject-net extraction portion extracting a subject net with a capacitance-attributable error, a network rip-up portion ripping up a cell netted in a predetermined range with respect to a subject net extracted by the subject-net extraction portion, and a constraint imposition portion imposing a wiring-capacitance constraint on a net connected to a cell ripped up by the network rip-up portion.

The network rip-up portion rips up a cell netted in a predetermined range with respect to a subject net and the constraint imposition portion imposes a wiring-capacitance constraint on a net connected to the cell ripped up. Depending on this information the automatic arrangement and routing tool can perform an ECO to eliminate a capacitance-attributable error only through modification in cell arrangement.

In another aspect of the present invention, the wiring-capacitance improvement aid device includes a trace-start-net designation portion designating a trace start net, a trace portion referring to net list information, tracing a network starting from a trace start net designated by the trace-start-net designation portion, and a trace-result output portion outputting a trace result obtained from the trace portion.

Since the trace-result output portion outputs a trace result obtained from the trace portion, the user can refer to the trace result to determine the cause of a capacitance-attributable error.

In still another aspect of the present invention, the wiring-capacitance improvement aid method is that which aids in eliminating a capacitance-attributable error of layout data generated by an automatic arrangement and routing tool performing arrangement and routing while referring to a wiring-capacitance constraint, including the steps of extracting a subject net with a capacitance-attributable error, ripping up a cell netted in a predetermined range with respect to the subject net extracted, and imposing a wiring-capacitance constraint on a net connected to the cell ripped up.

A cell netted in a predetermined range with respect to a subject net is ripped up and a wiring-capacitance constraint is imposed on a net connected to the cell ripped up. Based on this information the automatic arrangement and routing tool can perform an ECO to eliminate a capacitance-attributable error only through modification in cell arrangement.

In still another aspect of the present invention, the wiring-capacitance improvement aid method includes the steps of designating a trace start net, referring to net list information while tracing a network starting from the trace start net designated, and outputting a trace result.

The user can refer to the output trace result to determine the cause of a capacitance-attributable error.

In still another aspect of the present invention, a medium having a wiring-capacitance improvement aid program recorded thereon is that having recorded thereon a wiring-capacitance improvement aid program aiding in eliminating a capacitance-attributable error of layout data generated by an automatic arrangement and routing tool performing arrangement and routing with reference to a wiring-capacitance constraint, the wiring-capacitance improvement aid program including the steps of extracting a subject net with a capacitance-attributable error, ripping up a cell netted within a range with respect to the subject net extracted, and imposing a wiring-capacitance constraint on a net connected to the cell ripped up.

A cell netted within a predetermined range with respect to a subject net is ripped up and a wiring-capacitance constraint is imposed on a net connected to the cell ripped up. Based on this information the automatic arrangement and routing tool can perform an ECO to eliminate a capacitance-attributable error only through modification in cell arrangement.

In still another aspect of the present invention, the wiring-capacitance improvement aid program recorded on a medium includes the steps of designating a trace start net, referring to net list information while tracing a network starting from the trace start net designated, and outputting a trace result.

The user can refer to the output trace result to determine the cause of a capacitance-attributable error.

The foregoing and other objects, features, aspects and advantages of the present invention will become more

BRIEF DESCRIPTION OF THE DRAWINGS

FIG. 19 shows one example of a backward-trace result.

DESCRIPTION OF THE PREFERRED EMBODIMENTS

Figure 1:
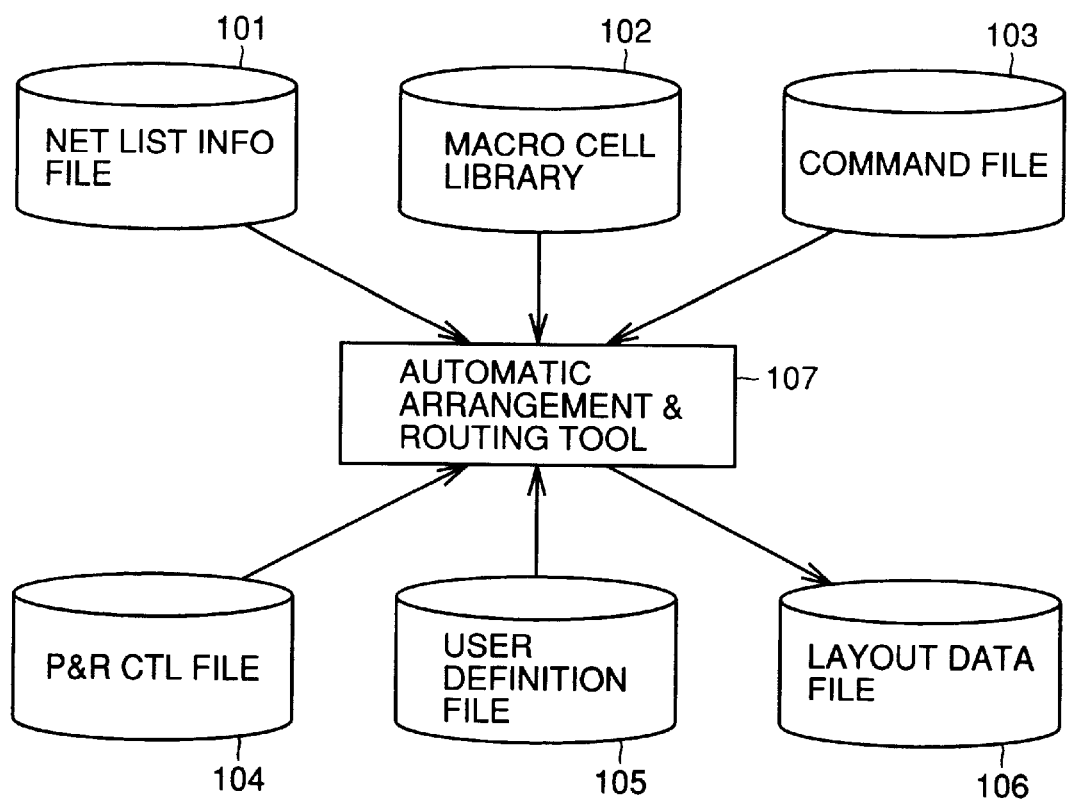
FIG. 1 is a view for illustrating files used by a conventional automatic arrangement and routing tool.
Figure 2:
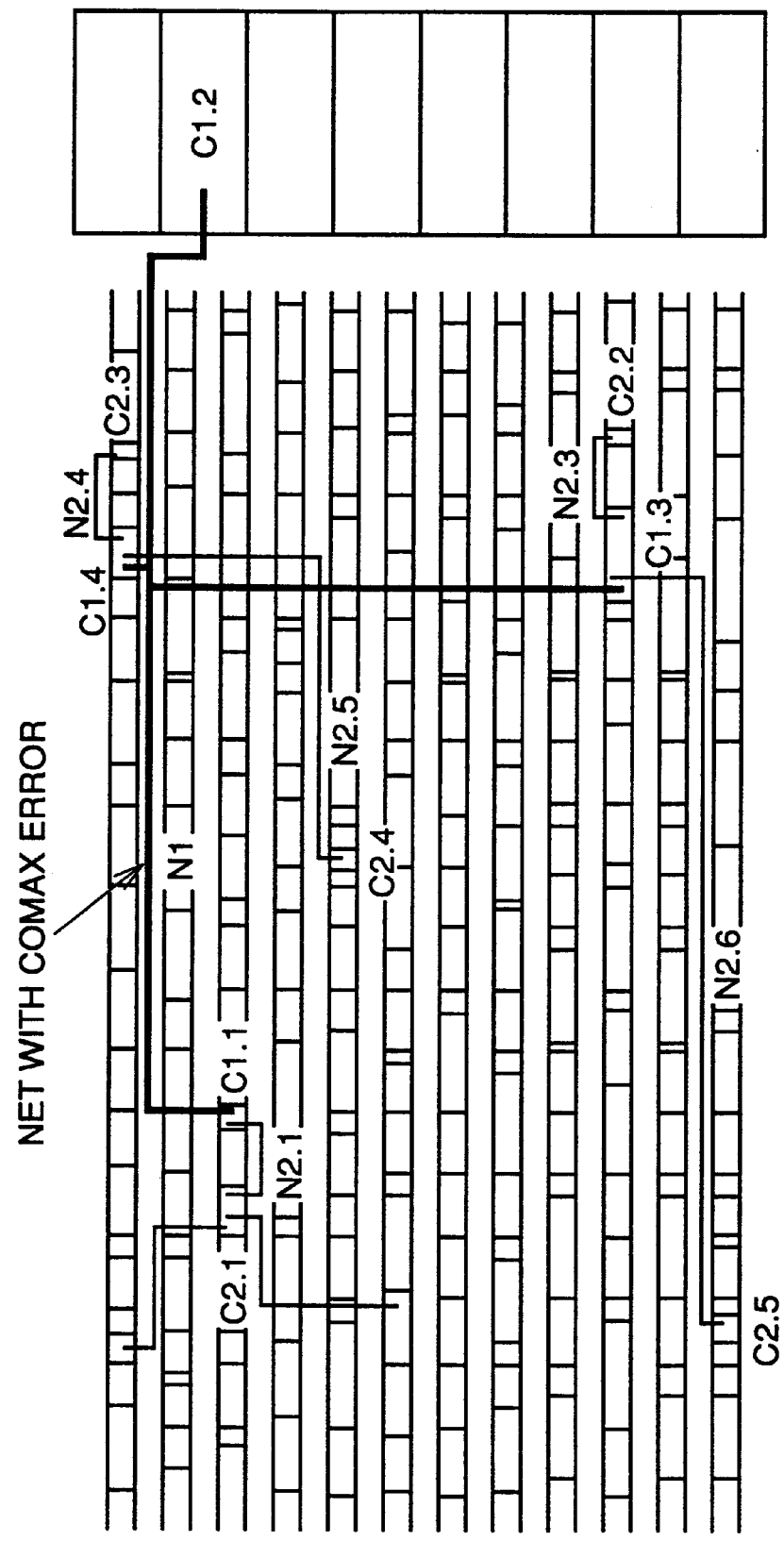
FIG. 2 is a view for illustrating a conventional procedure for eliminating a capacitance-attributable error.
Figure 3:
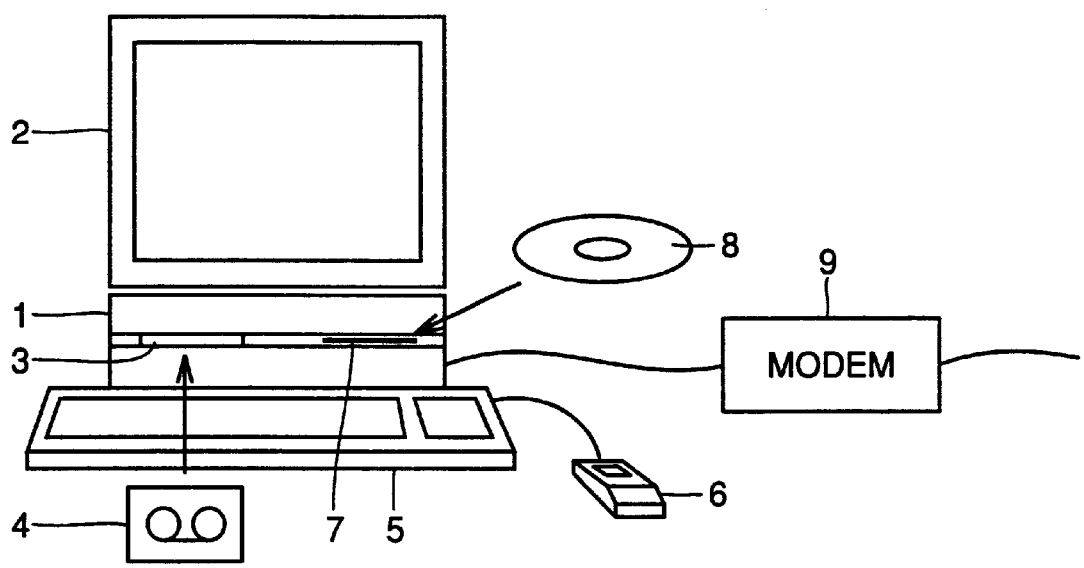
FIG. 3 shows an outer appearance of a wiring-capacitance improvement aid device in accordance with the present invention.

FIG. 3 shows an outer appearance of a wiring-capacitance improvement aid device according to the present invention. The wiring-capacitance improvement aid device includes the body of a computer 1, a graphic display device 2, a magnetic tape device 3 to which a magnetic tape 4 is mounted, a keyboard 5, a mouse 6, CD-ROM (compact disc-read only memory) device 7 to which a CD-ROM 8 is mounted, and a communication modem 9. A wiring-capacitance improvement aid program is supplied via storage media, such as magnetic tape 4, CD-ROM 8. The wiring-capacitance improvement aid program is ran by the body of computer 1 and the operator monitors graphic display device 2 while operating keyboard 5 or mouse 6 to aid in improving a wiring capacitance. The wiring-capacitance improvement aid program may be transmitted from another computer on a communication line and thus applied via communication modem 9 to the body of the computer 1.

Figure 4:
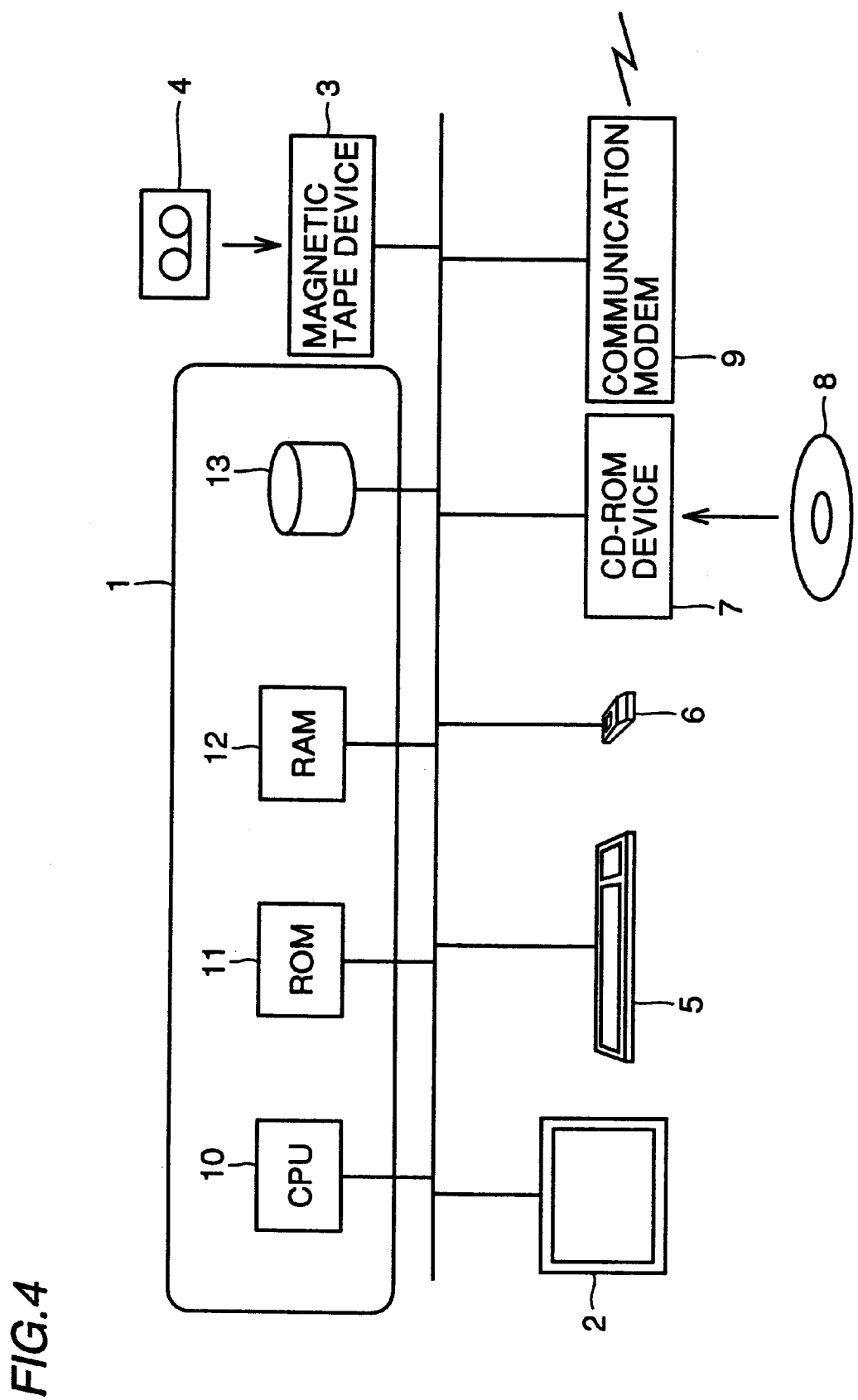
FIG. 4 is a block diagram for illustrating a schematic configuration of the wiring-capacitance improvement aid device according to the present invention.

FIG. 4 is a block diagram showing an exemplary configuration of the wiring-capacitance improvement aid device according to the present invention. The body of the computer 1 shown in FIG. 4 includes a CPU (central processing unit) 10, a ROM (read only memory) 11, a RAM (random access memory) 12 and a hard disc 13. CPU 10 performs processes while inputting and outputting data to and from graphic display device 2, magnetic tape device 3, keyboard 5, mouse 6, CD-ROM device 7, communication modem 9, ROM 11, RAM 12 or hard disc 13. The wiring-capacitance improvement aid program stored in magnetic tape 4 or CD-ROM 8 is first stored by CPU 10 into hard disc 13 via magnetic tape device 3 or CD-ROM device 7. CPU 10 appropriately loads the wiring-capacitance improvement aid program from hard disc 13 into RAM 12 and runs the program to aid in improving a wiring capacitance.

A wiring-capacitance improvement aid device of each embodiment of the present invention will now be described. The outer appearance of the wiring-capacitance improvement aid device shown in FIG. 3 and the configuration block diagram of the wiring-capacitance improvement aid device shown in FIG. 4 is common to the embodiments.

First Embodiment

Figure 5:
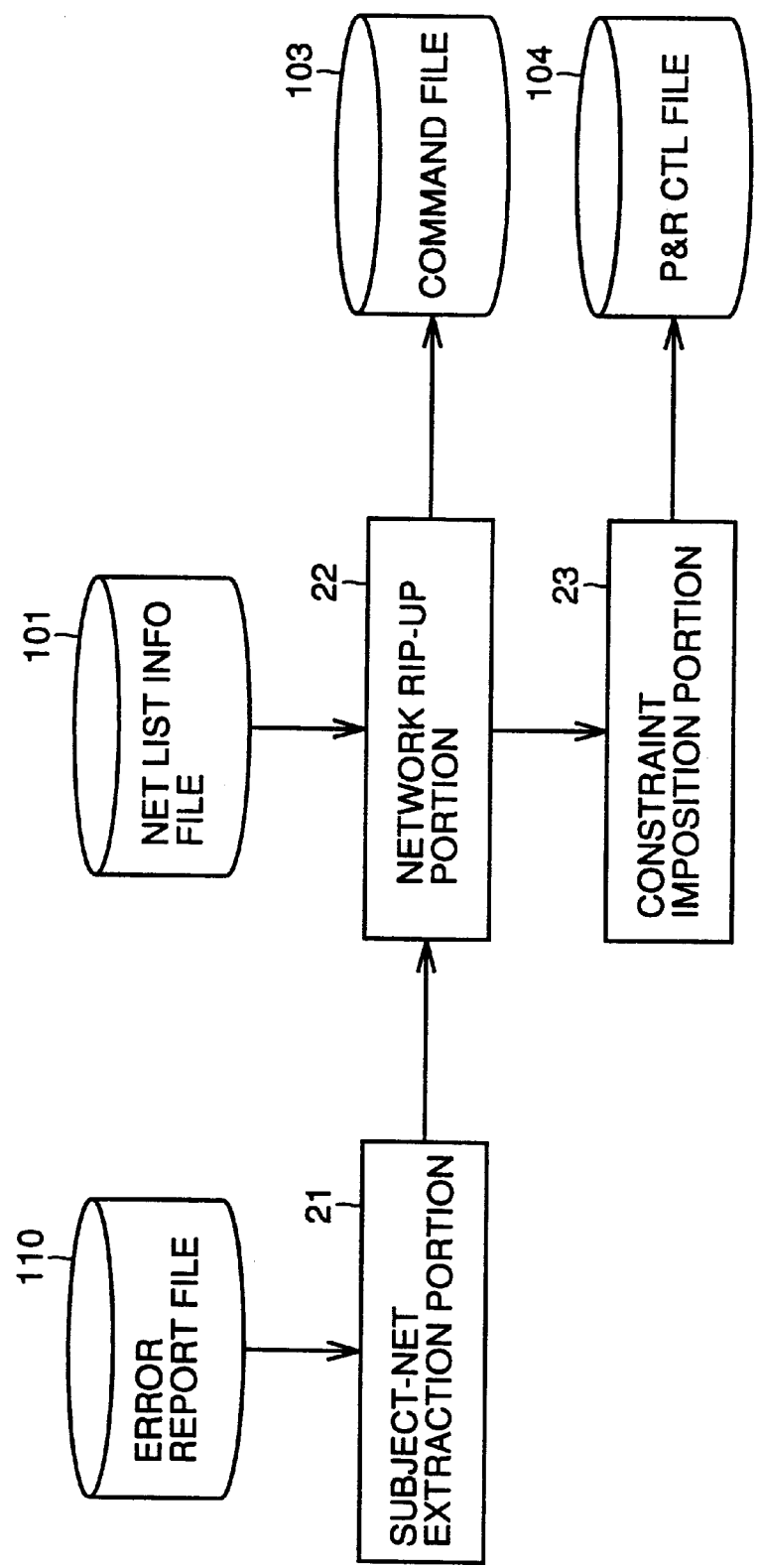
FIG. 5 is a block diagram showing a schematic configuration of a wiring-capacitance improvement aid device according to a first embodiment of the present invention.

FIG. 5 is a block diagram showing a configuration of a wiring-capacitance improvement aid device according to a first embodiment of the present invention. The wiring-capacitance improvement aid device includes a subject-net extraction portion 21 extracting a net with a capacitance-attributable error (referred to as a "subject net" hereinafter) with reference to an error report stored in an error report file 110, a network rip-up portion 22 ripping up a cell netted within a predetermined range with respect to a subject net extracted by subject-net extraction portion 21, and a constraint imposition portion 23 imposing a wiring-capacitance constraint on a subject net and a net connected to a cell ripped up by network rip-up portion 22. It should be noted that error report file 110 stores information on capacitance-attributable errors, such as Comax error, timing error and the like described in relation to the conventional art. "Ripping up" means that an arranged cell is placed in non-arranged condition and a routed net connected to the cell is placed in non-routed condition. "Network rip-up" means that a cell netted within a predetermined range with respect to a subject net is ripped up.

Figure 6:
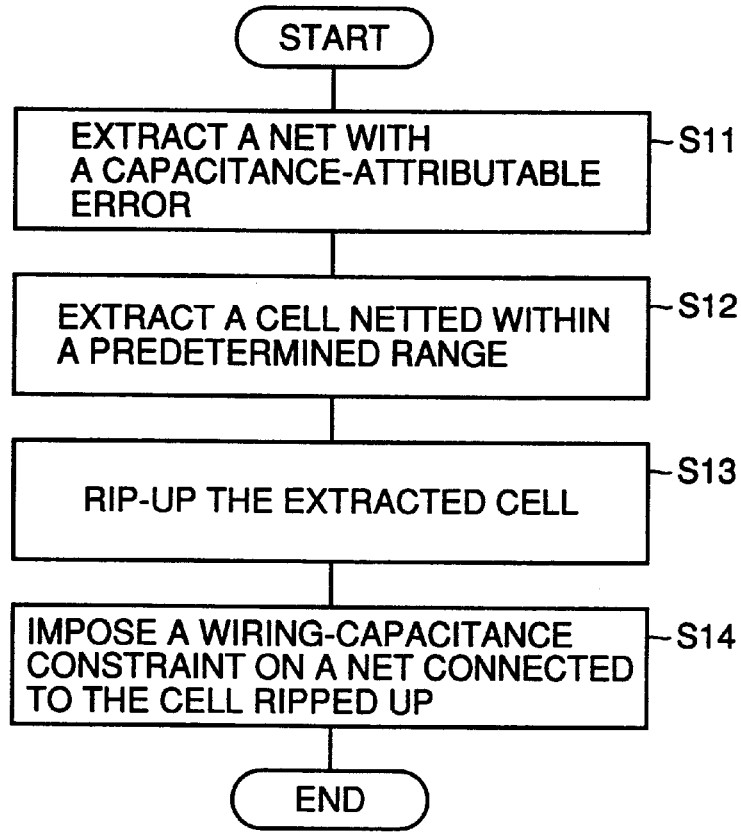
FIG. 6 is a flow chart of a process procedure of the wiring-capacitance improvement aid device according to the first embodiment of the present invention.

FIG. 6 is a flow chart of a process procedure of the wiring-capacitance improvement aid device according to the first embodiment of the present invention. Initially, subject-net extraction portion 21 reads an error report stored in error report file 110 and extracts a subject net with a capacitance-attributable error (S11). It should be noted that the user may designate a subject net.

Figure 7:
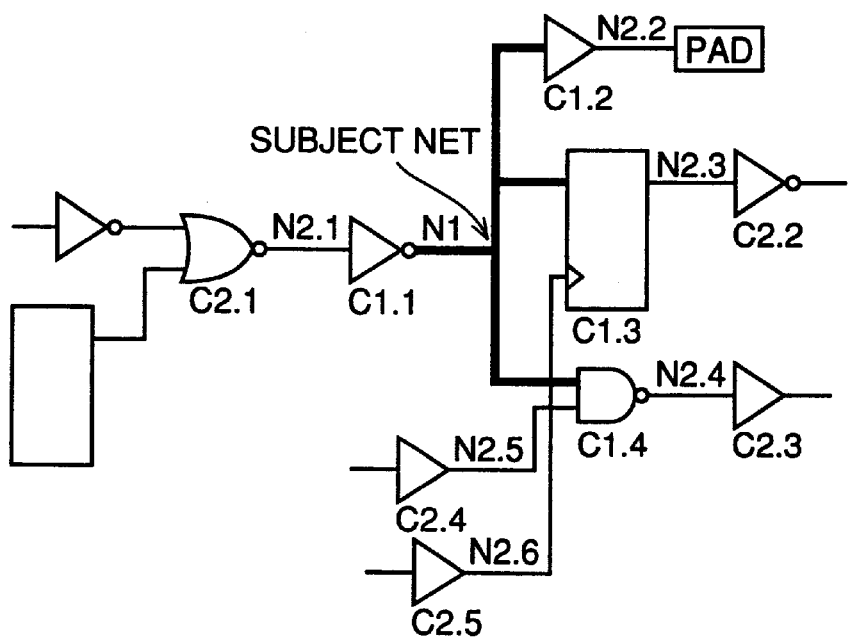
FIG. 7 shows one example of net list information of a logic circuit.

Network rip-up portion 22 then refers to the net list information stored in net list information file 101 and extracts any cells netted within a predetermined range with respect to the subject net (S12). For example, when the predetermined range with respect to the subject net corresponds to any cells connected to the subject net (i.e., for a cell-stage count of one), cells C1.1 to C1.4 connected to subject net N1 are extracted if the net list information of a logic circuit shown in FIG. 7 is stored in net list information file 101. If the predetermined range with respect to the subject net corresponds to any cells connected to the subject net and any cells connected to any nets connected to the cells connected to the subject net (i.e., for a cell-stage count of two), cells C1.1 to C1.4 connected to subject net N1 and cells C2.1 to C2.5 connected to nets N2.1 to N2.6 connected to cells C1.1 to C1.4 are extracted.

The extracted cells are then ripped up (S13). To rip up the extracted cells, network rip-up portion 22 adds a MoveCell description to command file 103. It should be noted that a cell fixed in arrangement (i.e. a cell designated as "FIXED" or "COVER" in the P&R control file), such as I/O buffer, RAM, PLL (phase locked loop) and the like, is not subject to ripping up. If the user sets an upper limit on fan-out for any cells ripped up, a cell with a large fan-out count can be free of ripping up.

Finally, constraint imposition portion 23 imposes a wiring-capacitance constraint on a net connected to a cell ripped up (S14). For example, when a single stage of cells is extracted, a wiring-capacitance constraint is imposed on subject net N1 and nets N2.1 to N2.6 connected to cells C1.1 to C1.4. When two stages of cells are extracted, a wiring-capacitance constraint is imposed on subject net N2.1, nets N2.1 to N2.6 connected to cells C1.1 to C1.4, and the nets connected to cells C2.1 to C2.5. To impose a wiring-capacitance constraint on a net, constraint imposition portion 23 adds to P&R control file 104 the information on the wiring-capacitance constraint imposed on the net.

The contents of command file 103 and P&R control file 104 are changed through the process described above. Automatic arrangement and routing tool 107 refers to the changed command file 103 and P&R control file 104 and thus performs an ECO to reduce the wiring length of subject net N1 and thus improve wiring capacitance.

Since the wiring-capacitance improvement aid device according to the present embodiment rips up a cell netted within a predetermined range with respect to a subject net and imposes a wiring-capacitance constraint on a net connected to the cell ripped up, an automatic arrangement and routing tool can perform an ECO to improve the wiring capacitance of the subject net.

Second Embodiment

Figure 8:
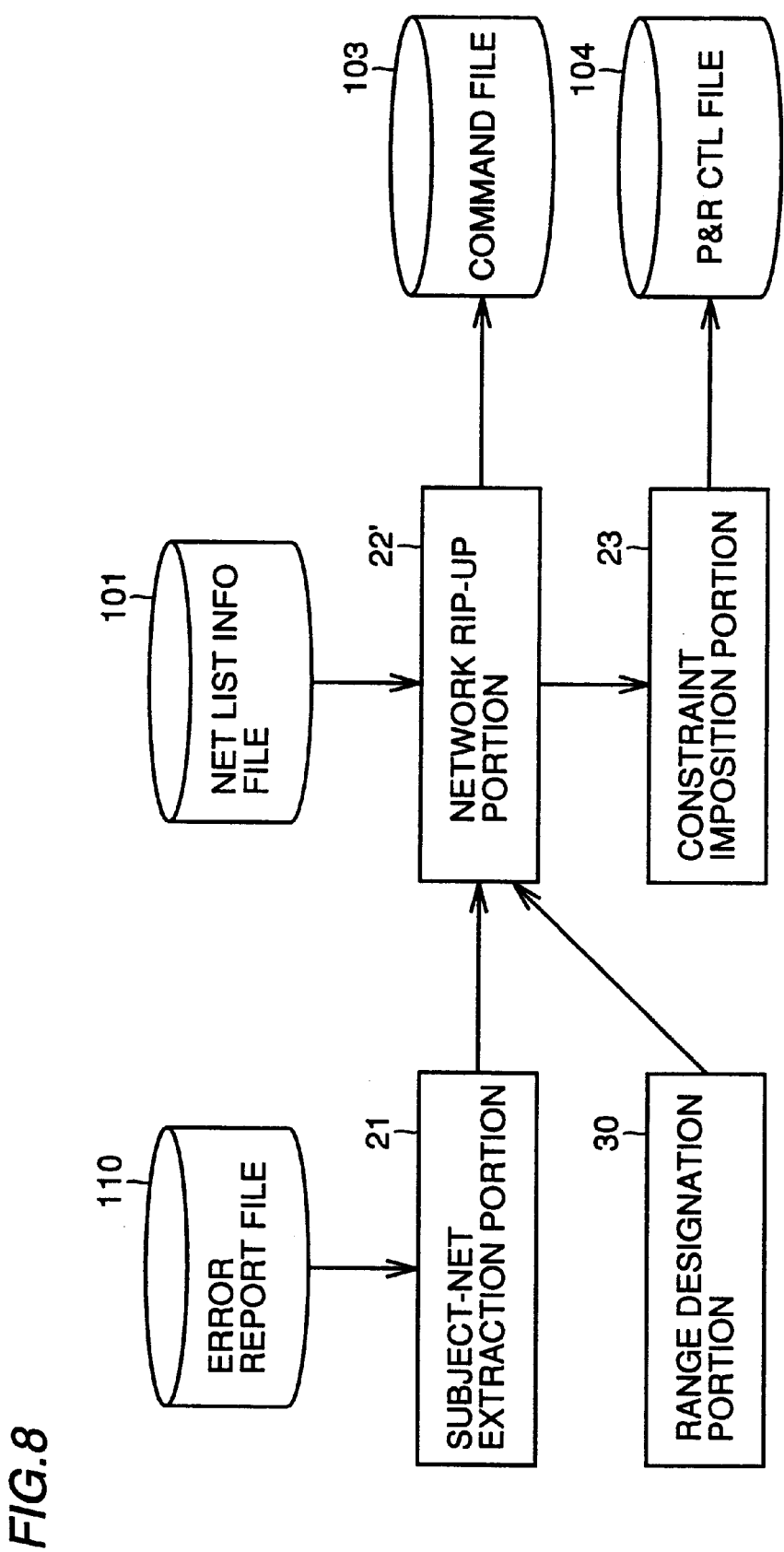
FIG. 8 is a block diagram showing a schematic configuration of a wiring-capacitance improvement aid device according to a second embodiment of the present invention.

FIG. 8 is a block diagram showing a schematic configuration of a wiring-capacitance improvement aid device according to a second embodiment of the present invention. It differs from the wiring-capacitance improvement aid device according to the first embodiment shown in FIG. 5 only in addition of a range designation portion 30 which designates a range of cells ripped up. Thus the detailed description of the overlapping configuration and functions will not be repeated.

Figure 9:
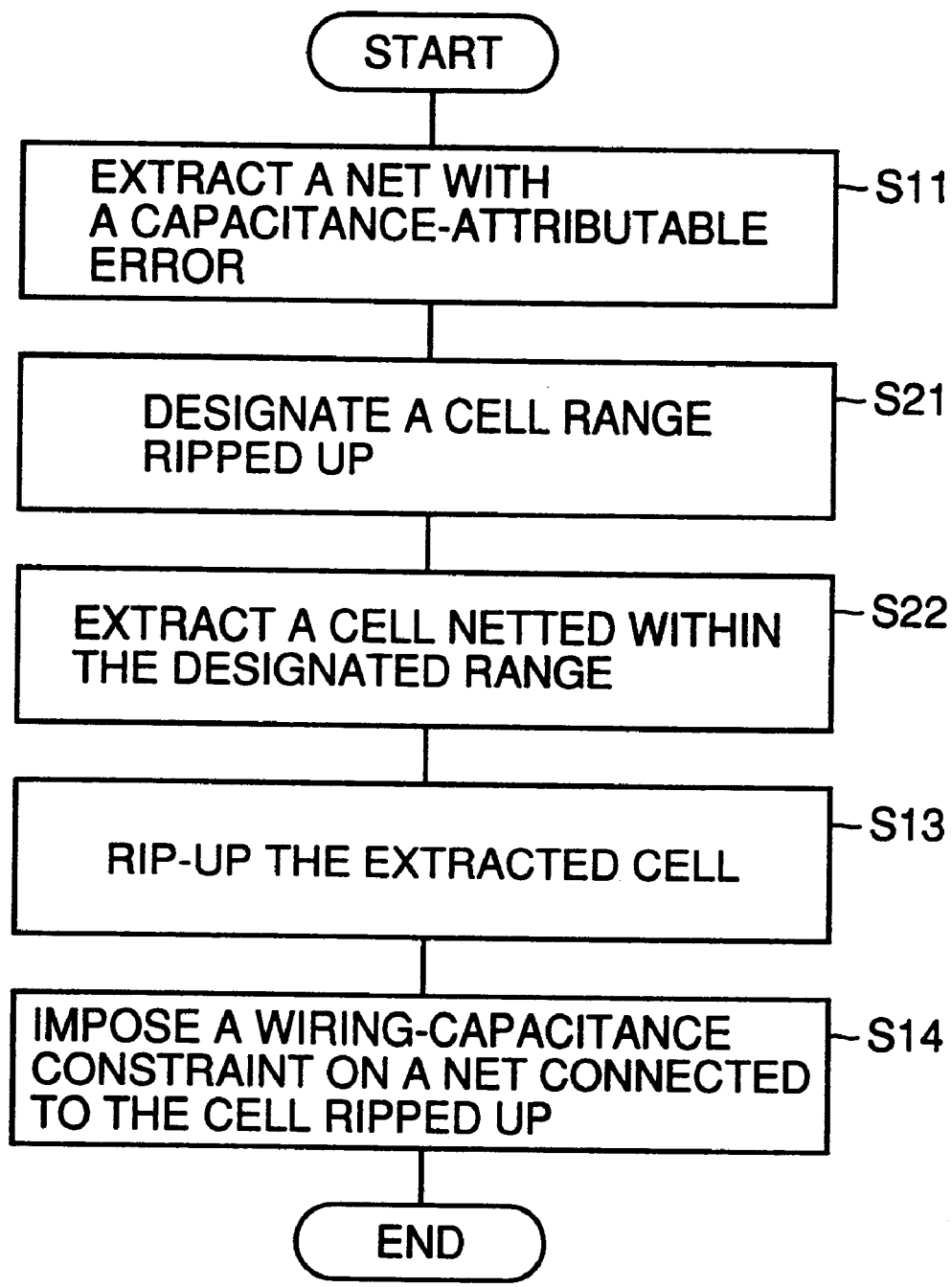
FIG. 9 is a flow chart of a process procedure of the wiring-capacitance improvement aid device according to the second embodiment of the present invention.

FIG. 9 is a flow chart of a process procedure of the wiring-capacitance improvement aid device according to the second embodiment. It differs from the flow chart of the wiring-capacitance improvement aid device according to the first embodiment shown in FIG. 6 only in that step S12 substitutes for steps S21 and S22. Thus the detailed description of the same steps of the process procedure will not be repeated.

The user designates a range of cells to be ripped up with respect to a subject net extracted at step S11 (S21). For example, ripping up the cells of one cell stage and imposing a wiling-capacitance constraint on the nets connected to the cells ripped up do not result in any improvement in wiring-capacitance, the number of cell stages ripped up is further increased to increase the range of cells ripped up.

Then, the cells netted within the designated range are extracted (S22). This step is the same as step S12 of FIG. 6 and the detailed description thereof is not repeated. The cells extracted within the designated range are subjected to the process from step S13 onward.

Thus the wiring-capacitance improvement aid device adapted to designate a range of cells ripped up can further improve a wiring capacitance by further increasing a designated number of cell stages ripped up when the wiring capacitance is not improved with the designated number of cell stages ripped up.

Third Embodiment

Figure 10:
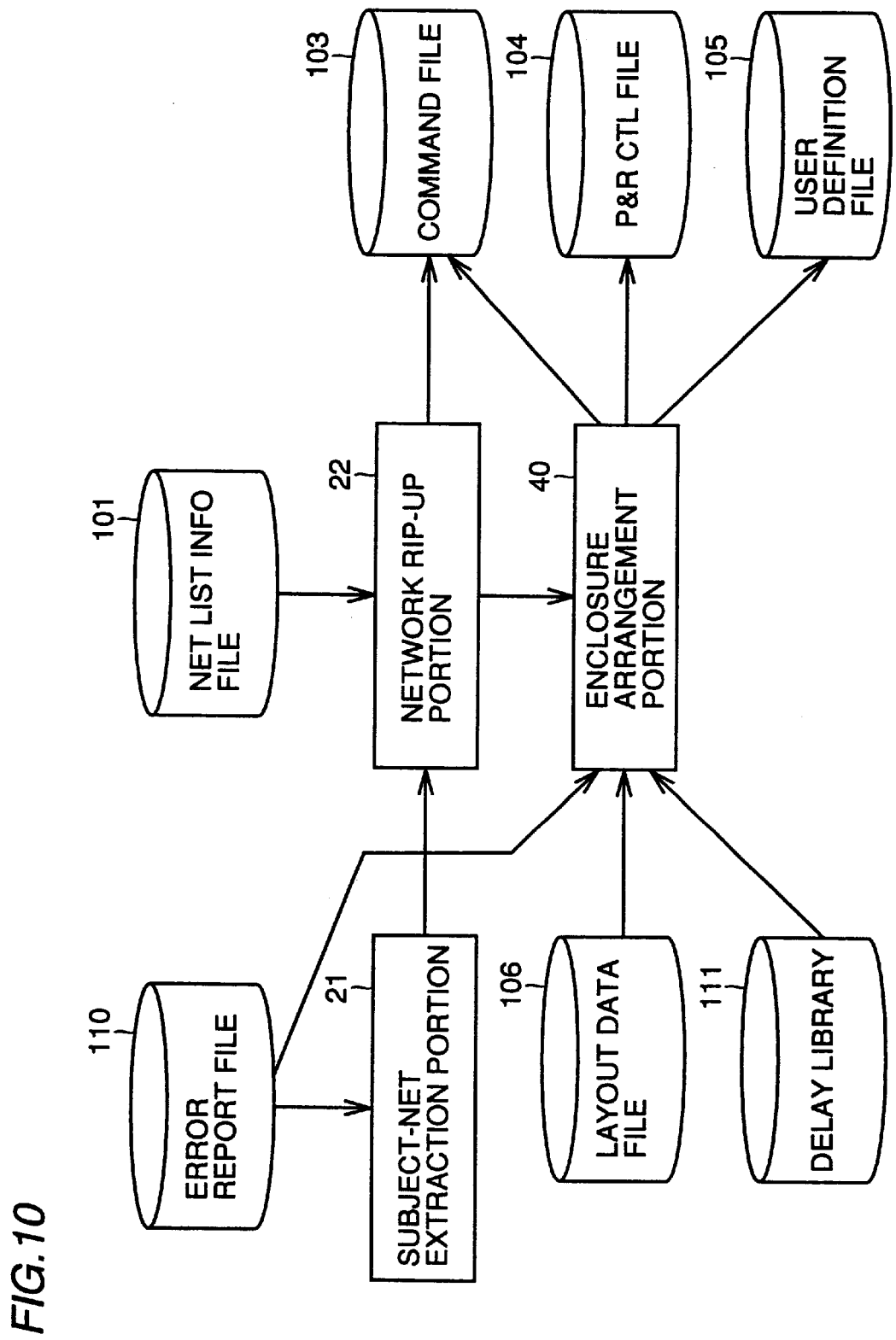
FIG. 10 is a block diagram showing a schematic configuration of a wiring-capacitance improvement aid device according to a third embodiment of the present invention.

FIG. 10 is a block diagram showing a schematic configuration of a wiring-capacitance improvement aid device according to a third embodiment of the present invention. It differs from the wiring-capacitance improvement aid device according to the first embodiment shown in FIG. 5 only in that constraint imposition portion 23 is replaced with an enclosure arrangement portion 40. Thus the detailed description of the same configuration and functions will not be repeated.

Figure 11:
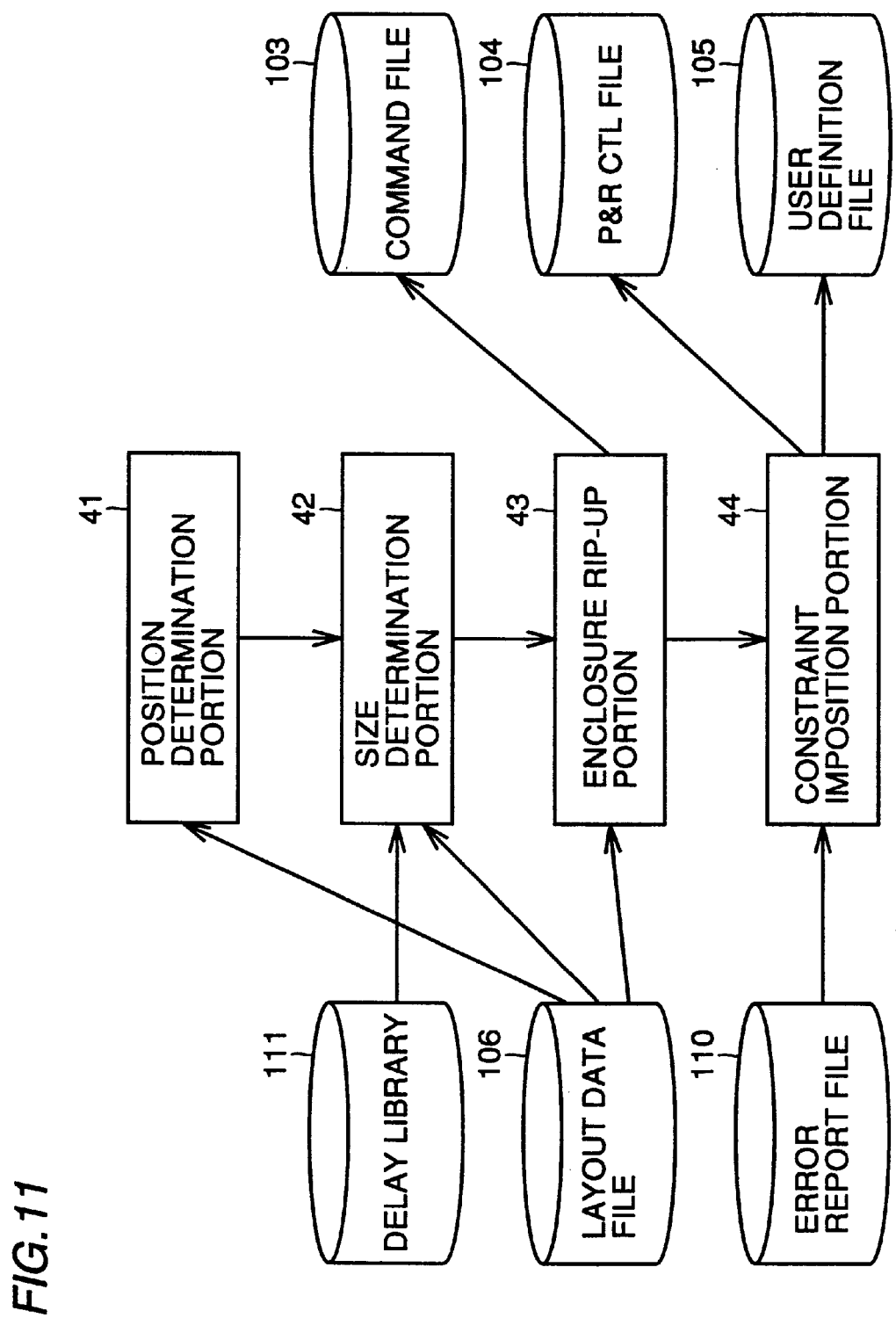
FIG. 11 is a block diagram showing a schematic configuration of an enclosure arrangement portion 40 shown in FIG. 10.

FIG. 11 is a block diagram showing a schematic configuration of the enclosure arrangement portion 40 shown in FIG. 10. Enclosure arrangement portion 40 includes a position determination portion 41 determining a position of a rectangular region in which cells connected to a subject net (referred to as "subject cells" hereinafter) are arranged, a size determination portion 42 determining a size of the rectangular region in which the subject cell is arranged, an enclosure rip-up portion 43 ripping up the cell in the rectangular region, and a constraint imposition portion 44 imposing a wiring-capacitance constraint on a net ripped up. It should be noted that constraint imposition portion 44 writes a coordinate value of the set rectangular region and a cell instance name of the subject cell in P&R control file 104 to instruct automatic arrangement and routing tool 107 to arrange the subject cell within the rectangular region. Enclosure rip-up portion 43 rips up the cell within the rectangular region to ensure a destination of the subject cell.

Figure 12:
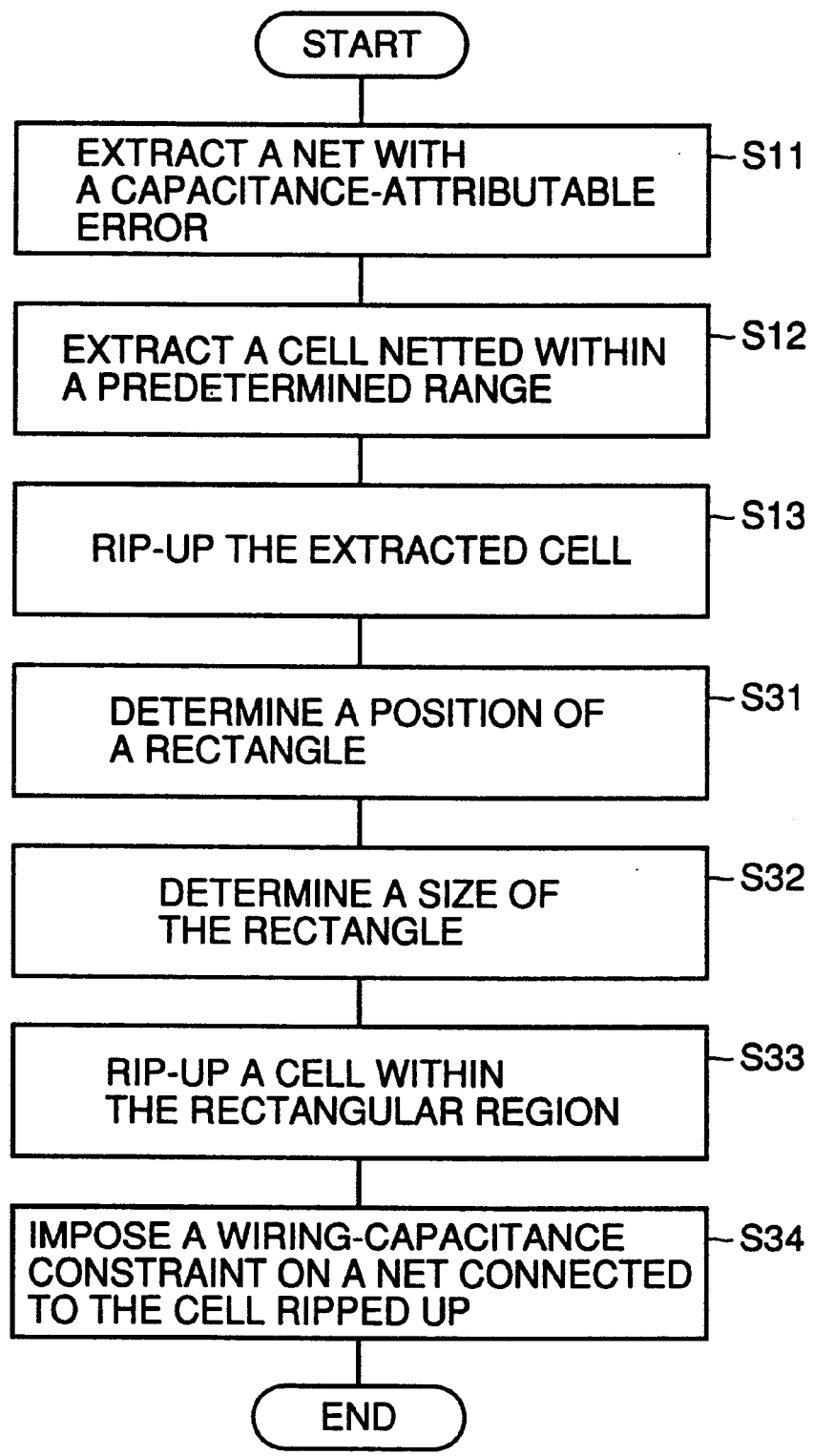
FIG. 12 is a flow chart of a process procedure of the wiring-capacitance improvement aid device according to the third embodiment of the present invention.

FIG. 12 is a flow chart of a process procedure of the wiring-capacitance improvement aid device according to the third embodiment. It differs from the flow chart of the wiring-capacitance improvement aid device according to the first embodiment shown in FIG. 6 only in that step S14 is replaced by steps S31 to S34. Thus the detailed description of the same process steps will not be repeated. The following description will be provided, with a predetermined range referred to at step S12 for a cell-stage count of one.

Position determination portion 41 refers to layout data stored in layout data file 106 to determine a position of a rectangular region in which a subject cell is to be arranged (S31). For example, position determination portion 41 so determines that the center of the rectangular region corresponds to the position of the barycenter of the subject cells. The position of the barycenter of the subject cells is determined by calculating an average X coordinate of the subject cells and an average Y coordinate of the subject cells.

Then, size determination portion 42 determines a size of the rectangular region in which the subject cell is to be arranged (S32). Typically, a virtual wiring-capacitance value can be obtained using a function of the fan-out count of a net and a region size in layout. Thus, the wiring-capacitance value of a net with a fan-out count can be no more than a value simply by arranging a cell connected to a subject net within a region size which satisfies the above function.

Figure 13B:
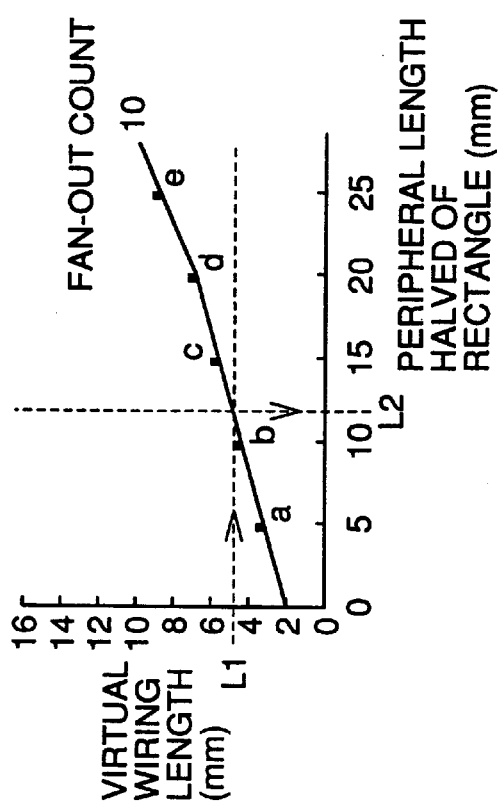
FIG. 13A is virtual wiring length versus fan-out count and FIG. 13B is virtual wiring length versus half of peripheral length of rectangle.
Figure 13A:
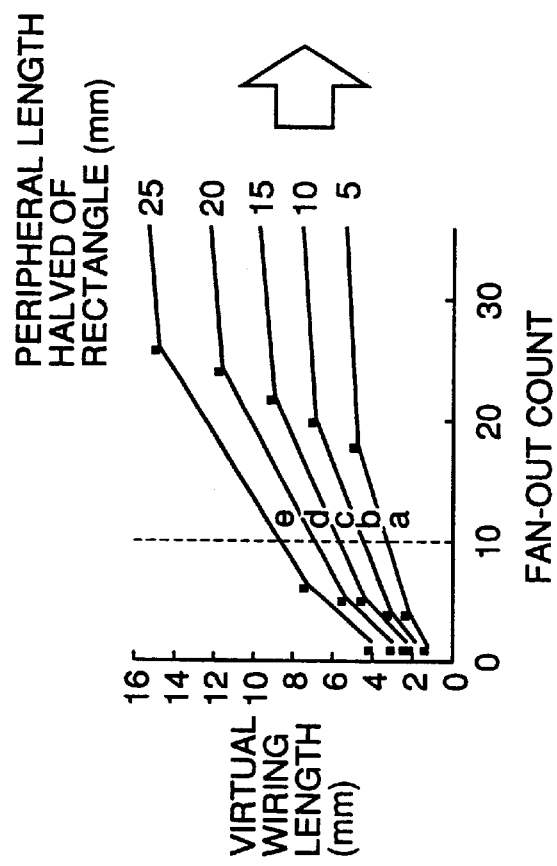

In delay library 111, a graph of virtual wiring length versus fan-out count when arrangement and routing are performed with an arrangement constraint imposed is defined for the respective peripheral lengths halved of various rectangles representing various degrees of arrangement constraint, as represented in FIG. 13A. When the graph is converted into a graph of virtual wiring length versus half of peripheral length of rectangle for various fan-out counts, half of the peripheral length of a rectangle of an enclosure region can be calculated from the fan-out count and wiring length desired to be implemented of a subject net. It should be noted that a wiring length desired to be implemented can be calculated by dividing a wiring-capacitance constraint value imposed on a subject net by a wiring-capacitance value per unit length.

FIG. 13B is a graph of virtual wiring length versus peripheral length halved of rectangle for a fan-out count of ten. To obtain this graph, delay library 111 is initially referred to to form the graph shown in FIG. 13A. Then, virtual wiring lengths a to e for the respective peripheral lengths of various rectangles for the fan-out count of ten are calculated. By plotting virtual wiring lengths a to e with the horizontal axis representing peripheral length halved of rectangle and the vertical axis representing virtual wiring length, the graph shown in FIG. 13B is formed. It should be noted that the ranges of no more than 5 mm and no less than 25 mm in peripheral length halved of rectangle are graphed out through interpolation with the gradient between virtual wiring lengths a and b and that between virtual wiring lengths d and e.

Size determination portion 42 refers to the graph of FIG. 13B thus provided, to obtain half of the peripheral length of a rectangle corresponding to a wiring length desired to be implemented. If the user designates a ratio between the width and height of a rectangle, size determination portion 42 calculates the width and height of the rectangle from the ratio. When the user does not designate a ratio of the width and height of a rectangle, size determination portion 42 assumes a width-to-height ratio of 1.0:1.0 to calculate the width and height of the rectangle. If an adjustment coefficient enabling adjustment of rectangle size is provided and the user designates the adjustment coefficient, size determination portion 42 multiplies the calculated width and height of a rectangle by the adjustment coefficient to adjust the size of the rectangle. If the user does not designate the adjustment coefficient, size determination portion 42 does not adjust rectangle size. It should be noted that in FIG. 14 the rectangular region described above is set in layout data generated by automatic arrangement and routing based on the net list shown in FIG. 7.

Then, enclosure rip-up portion 43 performs enclosure rip-up (S33). "Enclosure rip-up" means that a position of a rectangle determined by position determination portion 41 and a size of the rectangle determined by size determination portion 42 are used to set a rectangular region on layout data and a cell having its origin coordinate within the rectangular region is ripped up. As is similar to the network rip-up described above, enclosure rip-up portion 43 adds the Move-Cell description to command file 103 to rip up a cell having its origin coordinate within the rectangle.

Then, constraint imposition portion 44 adds a description to P&R control file 104 to impose a wiring-capacitance constraint on nets connected to cells ripped up through network rip-up and cells ripped up through enclosure rip-up. Constraint imposition portion 44 also determines a capacitance-constraint value from the following types of nets and types of constraint values to set a capacitance-constraint value for each of the nets.

Figure 14:
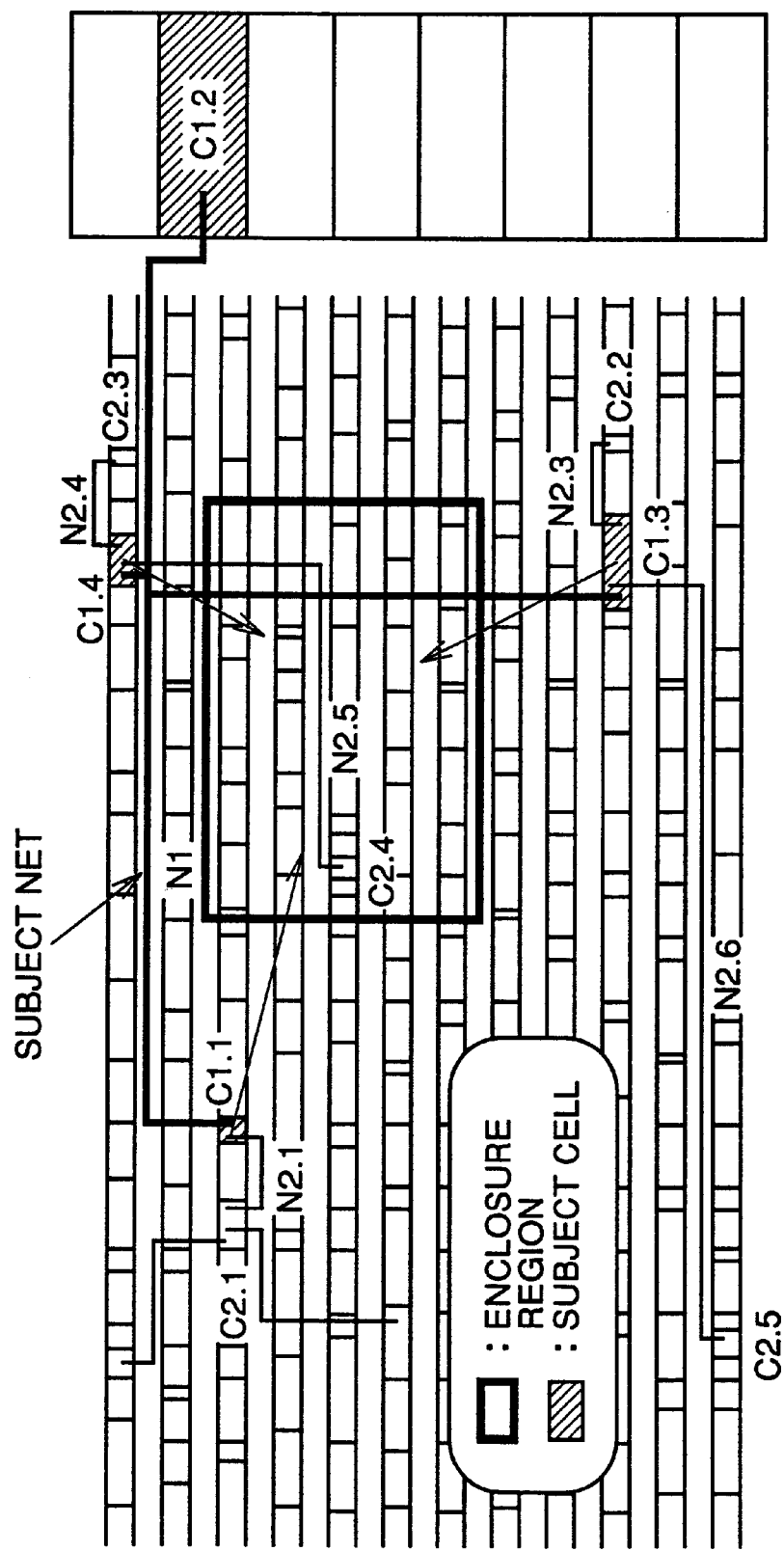
FIG. 14 shows layout data generated by automatic arrangement and routing based on the net list shown in FIG. 7, with a rectangular region set therein.

Types of Net
(1) Subject net
(2) Net ripped up through network rip-up
(3) Net ripped up through enclosure rip-up Types of Constraint Value
(a) Actual capacitance value of the current routed wiring
(b) Maximum wiring-capacitance value acceptable (Comax value)
(c) Virtual wiring-capacitance value For example, when as a result of timing simulation a timing error is caused in the FIGS. 7 and 14 subject net N1, constraint imposition portion 44 determines types of constraint value corresponding to types of net, as follows:

(1) Since subject net N1 has a timing error, the constraint value for subject net N1 is set to a virtual wiring-capacitance value to eliminate the timing error. It should be noted that it is assumed that in virtual timing verification any timing error is not caused in subject net N1.

(2) Nets N2.1 to N2.6 ripped up through network rip-up are set to have an actual capacitance value of the current routed wiring, since nets N2.1 to N2.6 are considered to be only required to maintain their respective current wiring-capacitance values.

Figure 15:
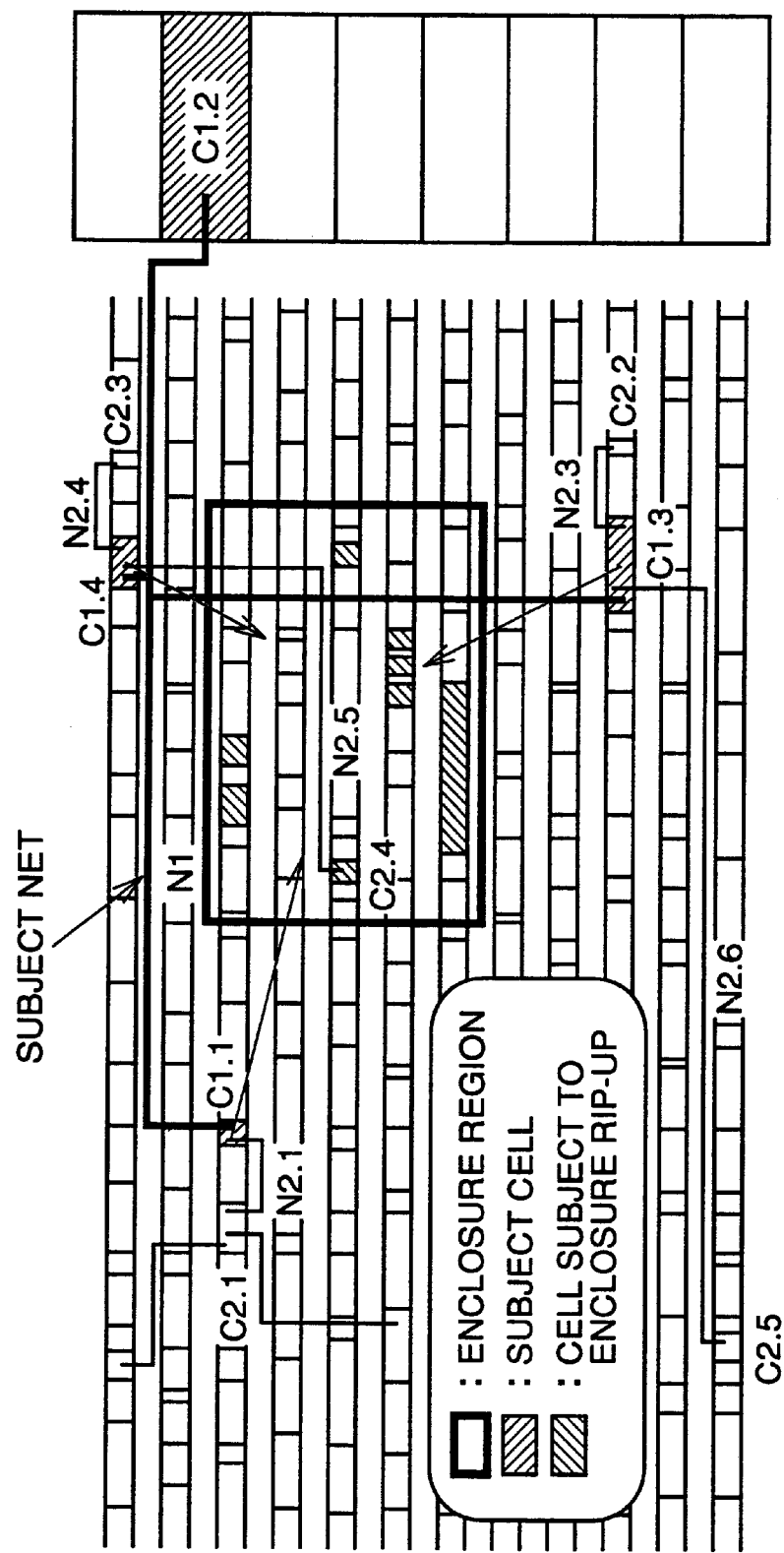
FIG. 15 shows types of net in the layout data shown in FIG. 14.

(3) A net ripped up through enclosure rip-up (net N2.5 connected to the FIG. 15 cell C2.4 and the like) is set to have an actual capacitance value of the current routed wiring, since it is considered to be only required to maintain the current wiring-capacitance value.

Constraint imposition portion 44 describes in user definition file 105 the wiring-capacitance value of each net thus determined. It should be noted that the wiring-capacitance values (a) to (c) described above are previously described in error report file 110 so that constraint imposition portion 44 refers to error report file 110 to set each wiring-capacitance value.

The contents of command file 103, P&R control file 104 and user definition file 105 are changed through the process described above. Automatic arrangement and routing tool 107 refers to the changed command file 103, P&R control file 104 and user definition file 105 to perform an ECO to arrange a subject cell substantially within a rectangular region and reduce the wiring length of subject net N1 to improve the wiring capacitance thereof. The nets ripped up through enclosure rip-up maintain the currently routed, wiring lengths.

The wiring-capacitance improvement aid device according to the present embodiment, setting a rectangular region in which a subject cell is arranged and imposing a wiring-capacitance constraint on a net ripped up through network rip-up and that ripped up through enclosure rip-up, as described above, can further improve the wiring capacitance of a subject net than the devices of the first and second embodiments.

Fourth Embodiment

Figure 16:
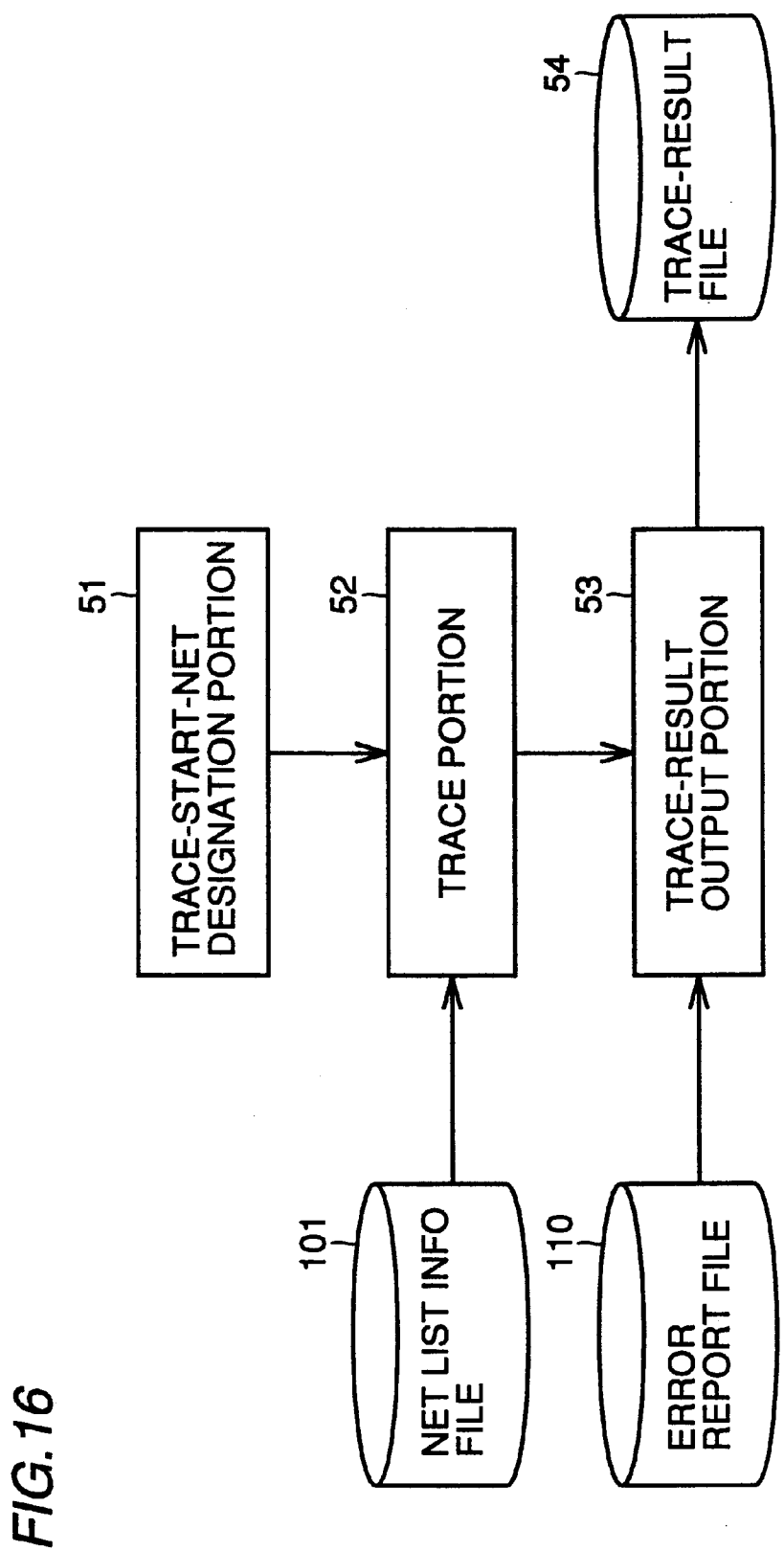
FIG. 16 is a block diagram showing a schematic configuration of a wiring-capacitance improvement aid device according to a fourth embodiment of the present invention.

FIG. 16 is a block diagram showing a schematic configuration of a wiring-capacitance improvement aid device according to a fourth embodiment. The wiring-capacitance improvement aid device includes a trace-start-net designation portion 51 designating a trace start net, a trace portion 52 referring to a net list stored in net list information file 101 to trace from a trace start net to a direction of an origin of signal propagation or trace backwards and to trace from a trace start net to the direction of a destination of signal propagation or trace forwards, and a trace-result output portion 53 outputting a trace result from trace portion 52 to a trace-result file 54.

Figure 17:
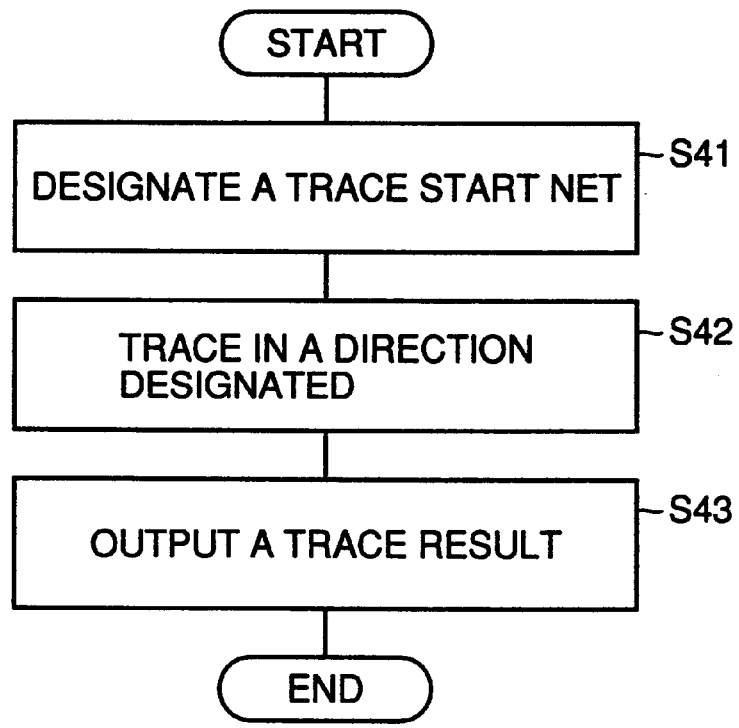
FIG. 17 is a flow chart of a process procedure of the wiring-capacitance improvement aid device according to the fourth embodiment of the present invention.

FIG. 17 is a flow chart of a process procedure of the wiring-capacitance improvement aid device according to the fourth embodiment. Initially, the user designates in trace-start-net designation portion 51 a trace start net for tracing (S41). When the user does not designate any trace start net, trace-start-net designation portion 51 designates a net with a capacitance-attributable error as a trace start net.

Then, trace portion 52 starts tracing from the trace start net, although the user previously designates which of backward trace, forward trace or bidirectional trace (backward and forward traces) is performed.

If the user designates backward trace, trace portion 52 traces from a trace start net to the direction of an origin of signal propagation and repeats tracing until an output terminal of a sequential circuit, such as a flip flop, or an external input pin is reached.

If the user designates forward trace, trace portion 52 traces from a trace start net to the direction of a destination of signal propagation and repeats tracing until an input terminal of a sequential circuit, such as a flip flop, or an external output pin is reached.

If the user designates bidirectional trace, trace portion 52 traces from a trace start net in the direction of an origin of signal propagation and the direction of a destination of signal propagation and repeats tracing until a trace-stage count designated by the user is reached. A trace-stage count is a value designating a range to be traced, designating a number of cell stages with a trace start net represented as zero and the number of cell stages traced therefrom represented as one, two, three, . . . , successively.

Figure 18:
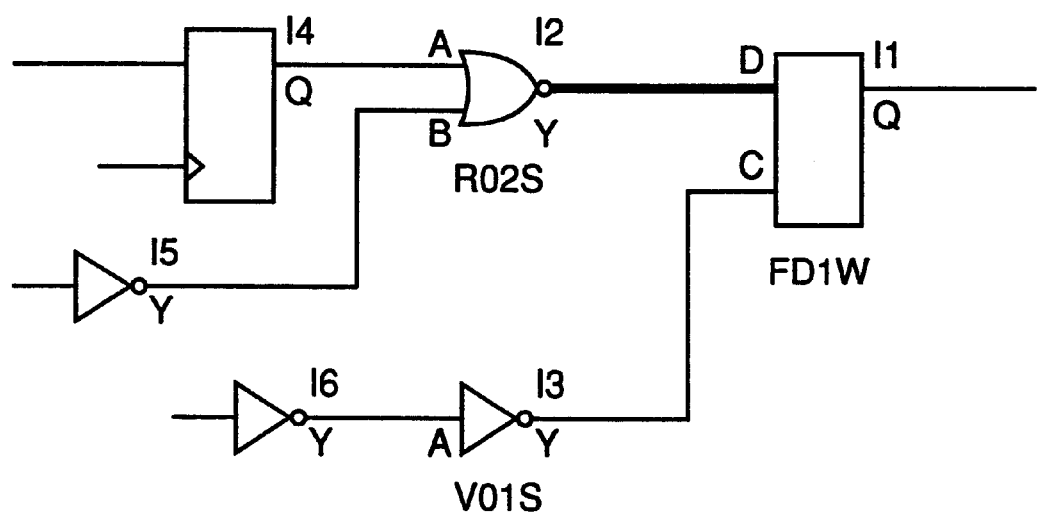
FIG. 18 shows one example of a net list of a logic circuit.

Let us now assume that the FIG. 18 logic circuit's net list is stored in net list information file 101. When the user designates as a trace start net a net connected to an output terminal Q of a cell instance I1 (with a macro cell name of FD1W) and also designates backward tracing, cell instance I1 (for a cell-stage count of one) is traced and so is a cell instance I2 (with a macro cell name of R02S) connected to a net connected to an input terminal D of cell instance I1. Since a cell instance I4 connected to a net connected to an input terminal A of cell instance I2 is a flip flop, the tracing in the direction of cell instance I2 input terminal A is terminated here. Furthermore, an instance I5 is traced by the tracing in the direction of cell instance I2 input terminal B. It should be noted that the trace in this direction is terminated here, since an input terminal of cell instance I5 is connected to an external input pin.

When a trace is also provided in the direction of cell instance I1 input terminal C, a cell instance I3 (with a macro cell name of V01S) and a cell instance I6 are traced successively. It should be noted that the trace in this direction is terminated here, since cell instance I6 has an input terminal connected to an external input pin.

Finally, trace-result output portion 53 outputs a trace result from the trace portion 52 (S43). FIG. 19 shows a list of an output result of tracing backwards from a net connected to output terminal Q of cell instance I1 shown in FIG. 18. The first line in the FIG. 19 list describes a message indicating a type of trace.

The next line describes cell instance I1 (with the macro cell name of FD1W) for a cell-stage count of one, as represented in FIG. 19 at ①. The next line describes that, as in FIG. 19 at ②, input terminal D of cell instance I1 is connected to an output terminal Y of cell instance I2 via net and that output terminal Y has a Comax value Cx of 4.791 pF, a net capacitance value Cn (Cw+Cp) of 0.39536 pF, a wiring-capacitance value Cw of 0.25936 pF, a total connection pin capacitance value Cp of 0.136 pF and an operating frequency F of 40 MHz.

The next line describes that output terminal Y is an output terminal of cell instance I2 (with a macro cell name of R02S), as represented at ③. The next line describes that, as represented at ④, input terminal A of cell instance I2 is connected to output terminal Q of cell instance I4 through net and the various capacitance values and operating frequency have the values as indicated in the figure, and the next line describes that, as indicated at ⑤, input terminal B of cell instance I2 is connected to output terminal Y of cell instance I5 via net and the respective various capacitance values and operating frequency have the values as indicated in the figure.

Similarly, at ⑥ to ⑨ are described a trace result when a backward trace is performed in the direction of cell instance I1 input terminal C. It should be noted that trace-result output portion 53 extracts each capacitance value and an operating frequency from error report file 110 and describes them in trace-result file 54.

The wiring-capacitance improvement aid device according to the present embodiment, outputting as a trace result a network of a net simply designated by the user, as described above, allows the user to readily determine the cause of a capacitance-attributable error.

It should be noted that while the wiring-capacitance improvement aid devices described above produce and edit command file 103, P&R control file 104 and user definition file 105 to allow an automatic arrangement and routing tool to perform an ECO, the files may be integrated into one or two files depending on the specification of the automatic arrangement and routing tool.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wiring-capacitance improvement aid device aiding in eliminating a capacitance-attributable error of layout data generated by an automatic arrangement and routing tool performing arrangement and routing while referring to a wiring-capacitance constraint, comprising:

a net extraction portion extracting a subject net with a capacitance-attributable error;

a network rip-up portion ripping up a cell netted within a predetermined range with respect to the subject net extracted by said net extraction portion; and a constraint imposition portion imposing a wiring-capacitance constraint on a net connected to the cell ripped up by said network rip-up portion.

2. The wiring-capacitance improvement aid device according to claim 1, wherein said network rip-up portion includes a command addition portion adding a command ripping up a cell to a command file referred to by said automatic arrangement and routing tool.

3. The wiring-capacitance improvement aid device according to claim 1, wherein said constraint imposition portion includes a constraint addition portion adding a wiring-capacitance constraint imposed on a net to an automatic arrangement-and-routing control file referred to by said automatic arrangement and routing tool.

4. The wiring-capacitance improvement aid device according to claim 1, further comprising a range designation portion designating a range of a cell netted with respect to the subject net extracted by said net extraction portion, wherein said network rip-up portion includes a range rip-up portion ripping up a cell netted with respect to said subject net within the range designated by said range designation portion.

5. The wiring-capacitance improvement aid device according to claim 1, further comprising a rectangular-region setting portion setting a rectangular region in said layout data, wherein said constraint imposition portion includes an arrangement instruction portion instructing arranging within said rectangular region the cell ripped up by said network rip-up portion.

6. The wiring-capacitance improvement aid device according to claim 5, wherein said rectangular-region setting portion includes:

a position determination portion referring to said layout data to determine a position of the rectangular region at which a subject cell is to be arranged; and a size determination portion determining a size of said rectangular region depending on a fan-out count of said subject net and a wiring-length desired to be implemented of said subject net.

7. The wiring-capacitance improvement aid device according to claim 1, further comprising a rectangular-region setting portion setting a rectangular region in said layout data, and an enclosure rip-up portion ripping up a cell contained in the rectangular region set by said rectangular-region setting portion, wherein said constraint imposition portion includes an arrangement instruction portion instructing arranging within said rectangular region the cell ripped up by said network rip-up portion.

8. The wiring-capacitance improvement aid device according to claim 7, wherein said rectangular-region setting portion includes:

a position determination portion referring to said layout data to determine a position of the rectangular region at which a subject cell is to be arranged; and a size determination portion determining a size of said rectangular region depending on a fan-out count of said subject cell and a wiring-length desired to be implemented of said subject net.

9. The wiring-capacitance improvement aid device according to claim 1, further comprising:

a rectangular-region setting portion setting a rectangular region in said layout data; and an enclosure rip-up portion ripping up a cell contained in the rectangular region set by said rectangular-region setting portion; wherein said constraint imposition portion includes an arrangement instruction portion imposing a wiring-capacitance constraint and a wiring-capacitance constraint value on a net connected to the cell ripped up by said network rip-up portion and a net connected to the cell ripped up by said enclosure rip-up portion, and instructing arranging within said rectangular region the cell ripped up by said network rip-up portion.

10. The wiring-capacitance improvement aid device according to claim 9, wherein said constraint imposition portion includes a constraint addition portion adding a wiring-capacitance constraint imposed on a net to an automatic arrangement-and-routing control file referred to by said automatic arrangement and routing tool.

11. The wiring-capacitance improvement aid device according to claim 9, wherein said constraint imposition portion includes a constraint-value addition portion adding a wiring-capacitance constraint value of a net to a user definition file referred to by said automatic arrangement and routing tool.

12. A wiring-capacitance improvement aid device comprising:

a trace-start-net designation portion designating a trace start net;

a trace portion referring to net list information to trace a network of the trace start net designated by said trace-start-net designation portion; and a trace-result output portion outputting a trace result obtained from said trace portion.

13. The wiring-capacitance improvement aid device according to claim 12, wherein said trace portion includes a backward trace portion tracing a network from the trace start net designated by said trace-start-net designation portion to a direction of an origin of signal propagation.

14. The wiring-capacitance improvement aid device according to claim 12, wherein said trace portion includes a forward trace portion tracing a network from the trace start net designated by said trace-start-net designation portion to a direction of a destination of signal propagation.

15. The wiring-capacitance improvement aid device according to claim 12, wherein said trace portion includes a bidirectional trace portion tracing a network from the trace start net designated by said trace-start-net designation portion to both directions of an origin of signal propagation and a destination of signal propagation.

* * * * *